(12) United States Patent
Faase et al.

(10) Patent No.: US 7,741,751 B2
(45) Date of Patent: Jun. 22, 2010

(54) MEMS DEVICE HAVING DISTANCE STOPS

(75) Inventors: Kenneth J. Faase, Corvallis, OR (US); Tony S. Cruz-Uribe, Corvallis, OR (US); Eric L. Nikkei, Philomath, OR (US); Adel Jilani, Redmond, WA (US); Bao Yeh, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1022 days.

(21) Appl. No.: 11/479,271

(22) Filed: Jun. 30, 2006

(65) Prior Publication Data
US 2008/0001913 A1   Jan. 3, 2008

(51) Int. Cl.
*H02N 1/00* (2006.01)
*H01H 57/00* (2006.01)

(52) U.S. Cl. .................. 310/309; 200/181; 359/291

(58) Field of Classification Search ............ 310/309; 200/181; 385/16, 18; 359/290, 291; 345/108
See application file for complete search history.

(56) References Cited

U.S. PATENT DOCUMENTS

| | | | |
|---|---|---|---|
| 5,142,414 A | 8/1992 | Koehler | |
| 5,181,013 A | 1/1993 | Bagshaw et al. | |
| 5,771,321 A | 6/1998 | Stern | |
| 5,835,255 A | 11/1998 | Miles | |
| 5,986,796 A | 11/1999 | Miles | |
| 6,031,653 A | 2/2000 | Wu | |
| 6,040,936 A | 3/2000 | Kim et al. | |
| 6,040,937 A | 3/2000 | Miles | |
| 6,154,591 A | 11/2000 | Kershaw | |
| 6,373,632 B1 | 4/2002 | Flanders | |
| 6,384,953 B1 | 5/2002 | Russell et al. | |
| 6,392,341 B2 | 5/2002 | Jacobsen et al. | |
| 6,512,625 B2 * | 1/2003 | Mei et al. | 359/290 |
| 6,555,904 B1 | 4/2003 | Karpan | |
| 6,650,455 B2 | 11/2003 | Miles | |
| 6,674,562 B1 | 1/2004 | Miles | |

(Continued)

FOREIGN PATENT DOCUMENTS

JP        2001042233    *   2/2001

(Continued)

OTHER PUBLICATIONS

PCT International Preliminary Report on Patentability, in corresponding PCT case PCT/US2007/072363, mailed Jan. 15, 2009.

(Continued)

*Primary Examiner*—Karl I Tamai

(57) ABSTRACT

A micro-electromechanical systems (MEMS) device includes bottom and top capacitive plates, such that a capacitor is definable therebetween. A mechanism is electrostatically movably disposed between the bottom and top capacitive plates. One or more flexures are movably disposed between the bottom capacitive plate and the mechanism, and having distance stops between the bottom capacitive plate and the mechanism corresponding to maximum downward movement. The MEMS device includes one or more electrodes of the bottom capacitive plate corresponding to the flexures. Energizing different of the electrodes causes the flexures to move to different of the distance stops, causing the mechanism to move to different positions between the bottom and top capacitive plates.

19 Claims, 10 Drawing Sheets

U.S. PATENT DOCUMENTS

| | | | |
|---|---|---|---|
| 6,680,792 B2 | 1/2004 | Miles | |
| 6,791,735 B2 * | 9/2004 | Stappaerts | 359/245 |
| 6,967,757 B1 | 11/2005 | Allen et al. | |
| 7,265,477 B2 * | 9/2007 | Wan | 310/309 |
| 2002/0015215 A1 | 2/2002 | Miles | |
| 2002/0024711 A1 | 2/2002 | Miles | |
| 2002/0036828 A1 | 3/2002 | Wong | |
| 2002/0054424 A1 | 5/2002 | Miles | |
| 2002/0126864 A1 | 9/2002 | Miles | |
| 2002/0149834 A1 * | 10/2002 | Mei et al. | 359/295 |
| 2003/0178913 A1 * | 9/2003 | Norimatsu | 310/309 |
| 2006/0119922 A1 | 6/2006 | Faase et al. | |
| 2007/0064295 A1 * | 3/2007 | Faase et al. | 359/245 |
| 2008/0001913 A1 * | 1/2008 | Faase et al. | 345/108 |

FOREIGN PATENT DOCUMENTS

WO   02/079853 A1   10/2002

OTHER PUBLICATIONS

Stephen D. Russell et al., Transmissive Surface-Plasmon Light Valves, Jet Propulsion Laboratory (JPL) Report NPO-20280, Jun. 1999.

\* cited by examiner

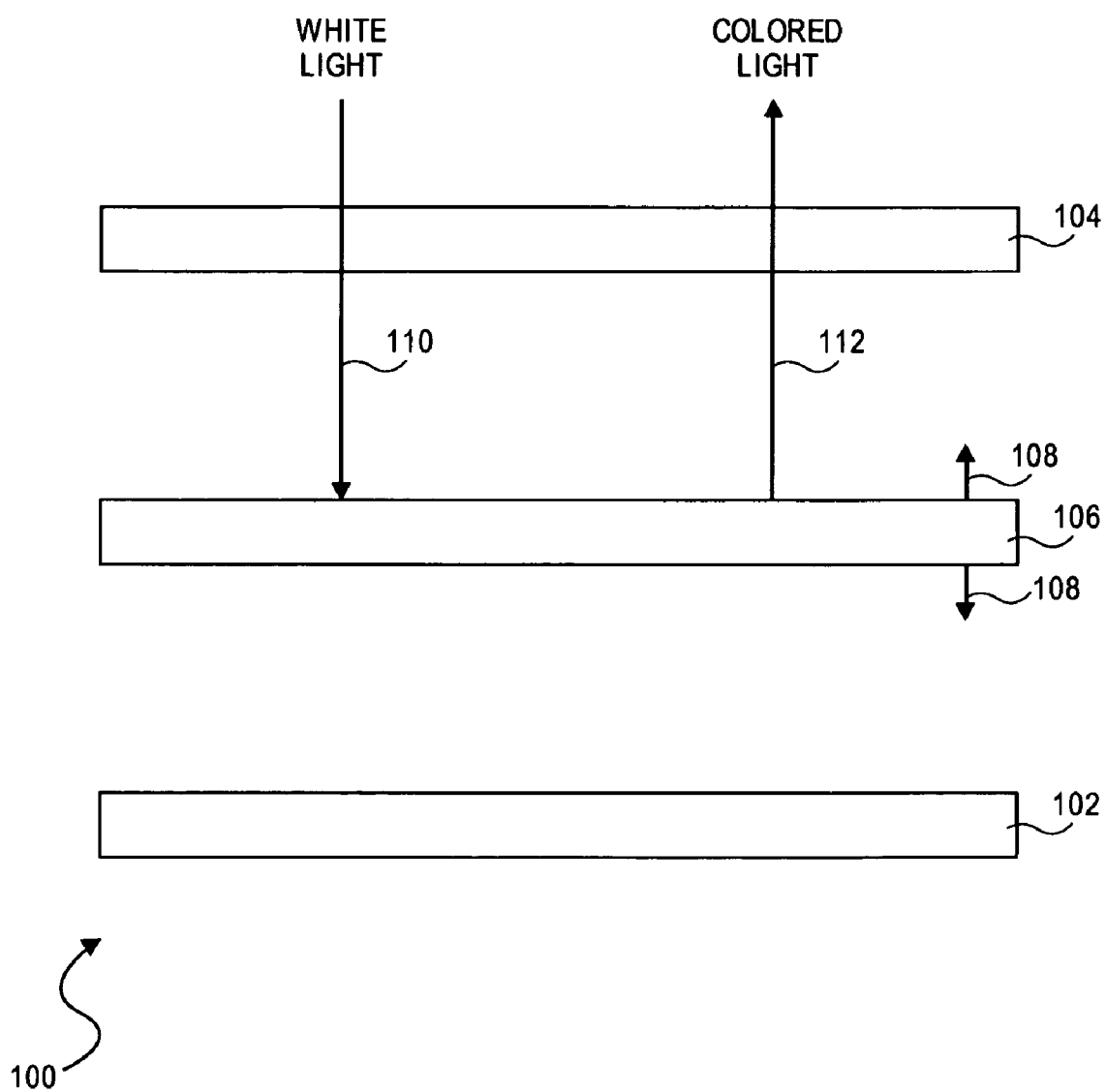

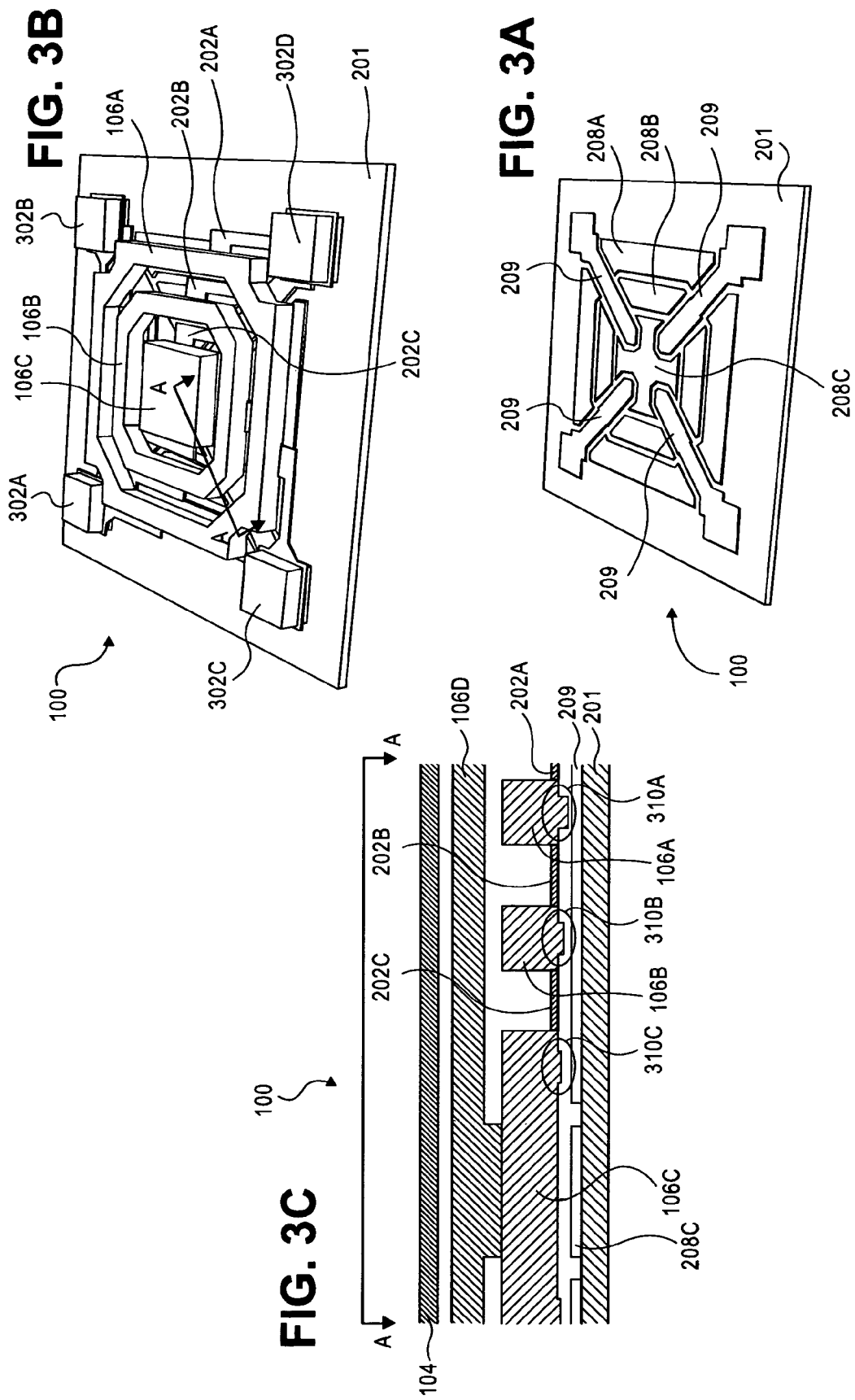

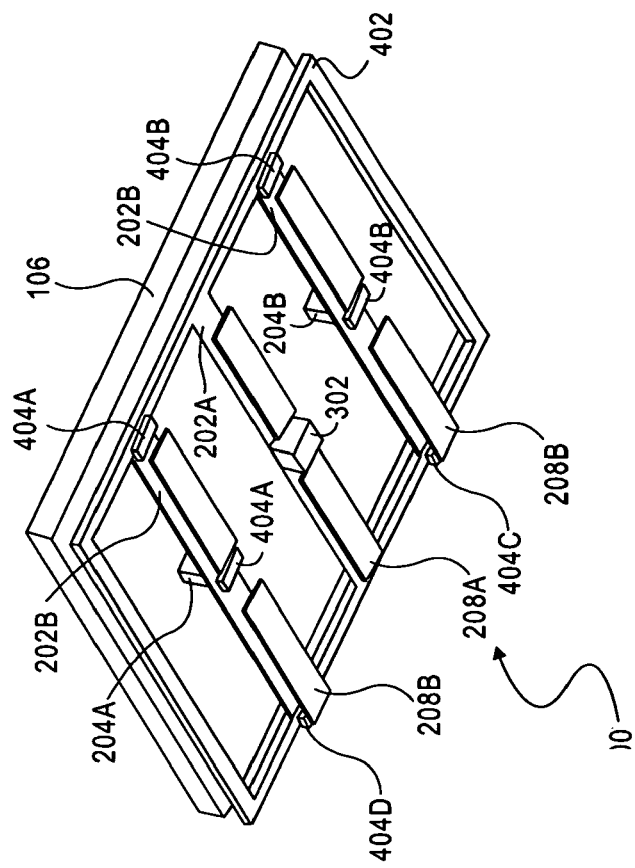
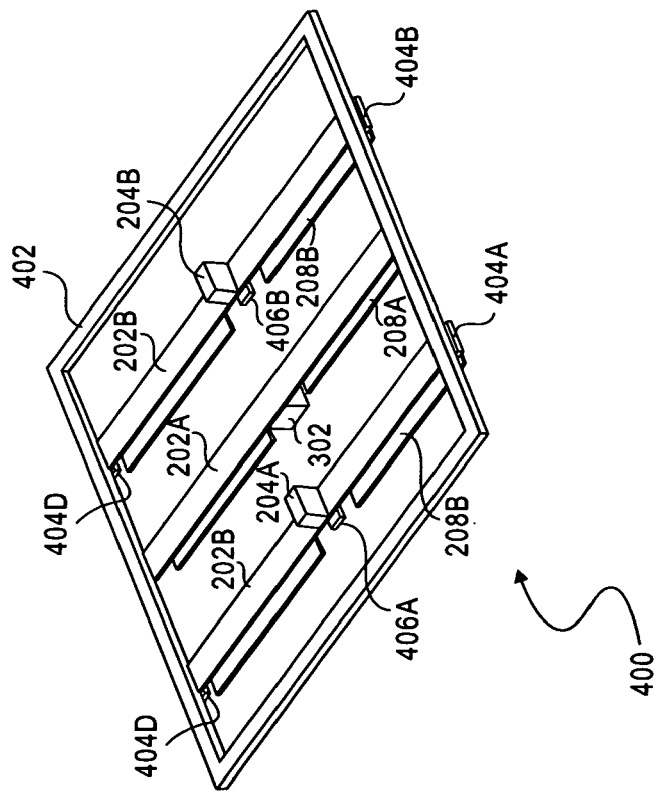

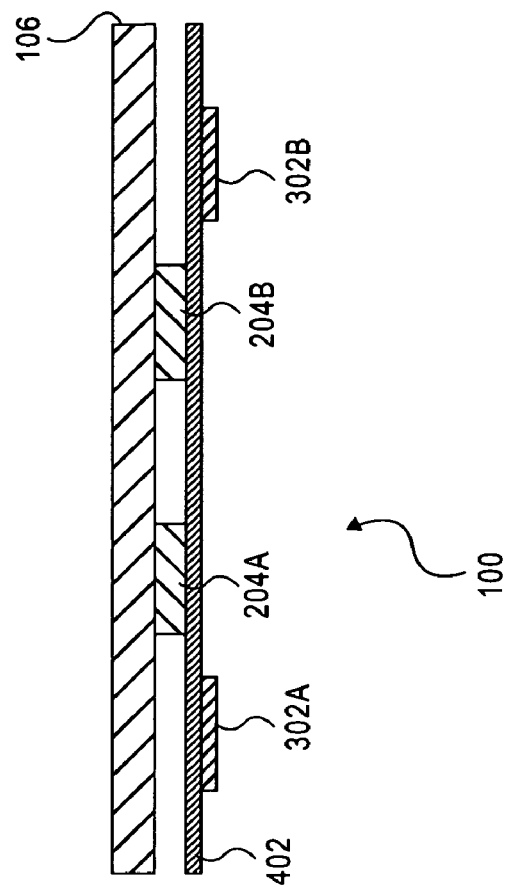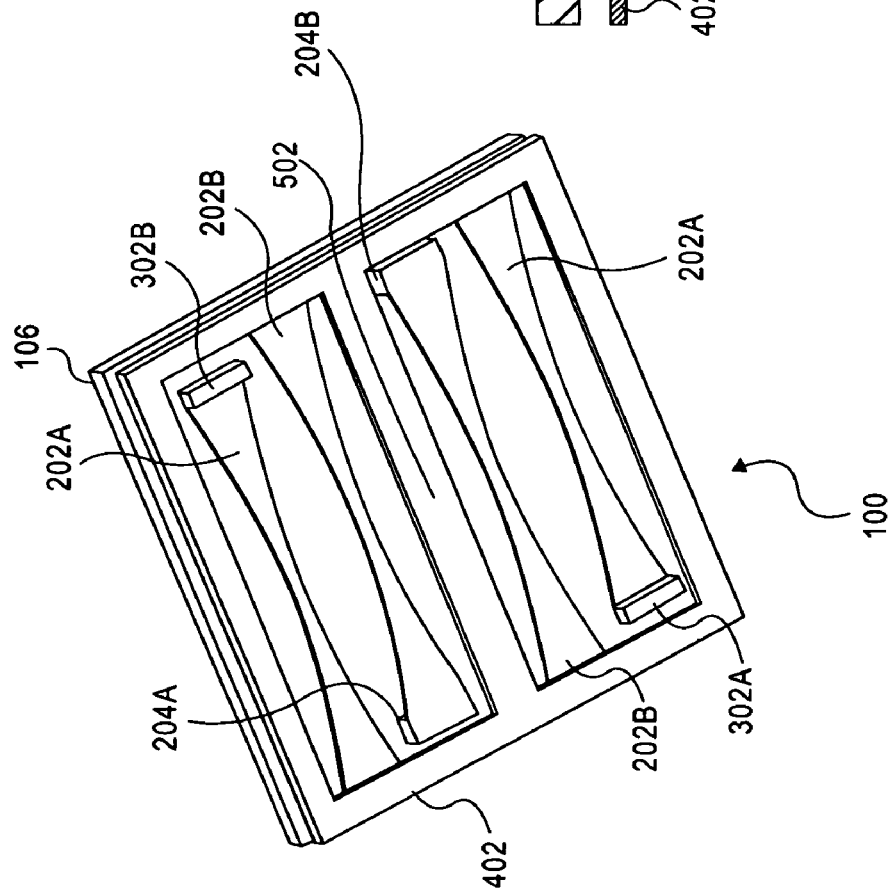

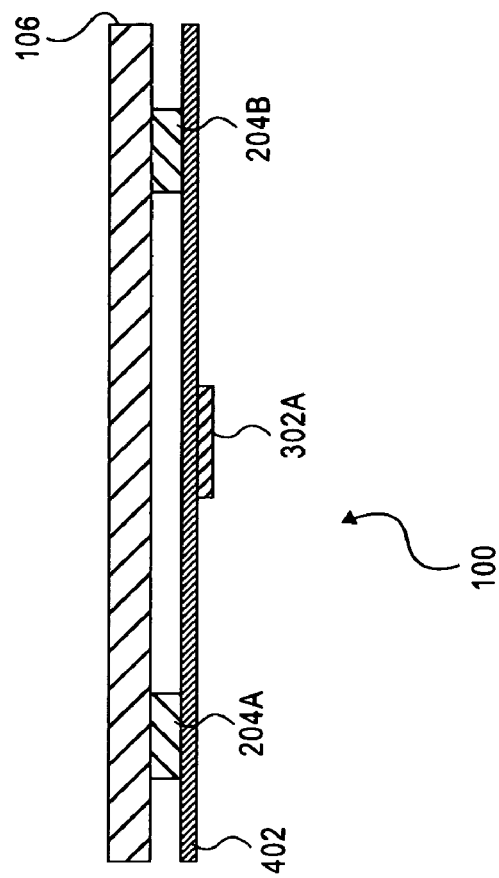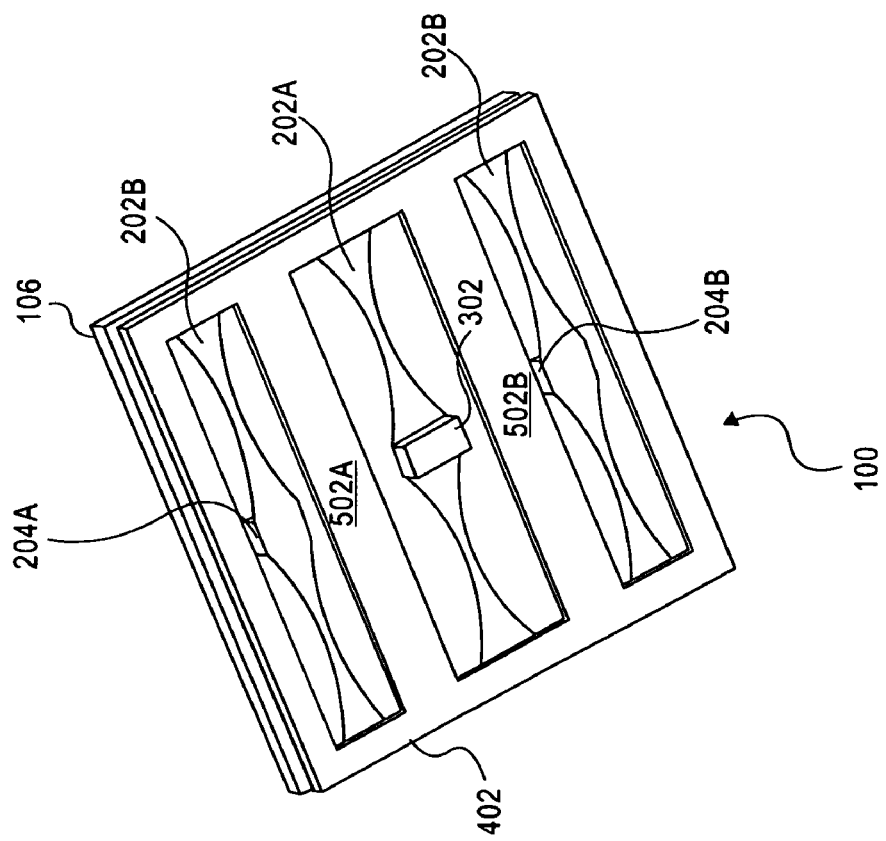

MEMS DEVICE HAVING DISTANCE STOPS

BACKGROUND

Some types of devices employ a micro-electromechanical systems (MEMS) device. For instance, a display device to display image data from a computer or another type of electronic or computing device can use a MEMS device to modulate light in accordance with the image data. One type of MEMS device employs a reflective plate that is electrostatically moved to different positions in accordance with the image data to be displayed.

However, for this type of MEMS device to accurately display image data, positioning of the reflective plate within the MEMS device has to be controlled in a stable and precise manner. Otherwise, the color and/or intensity (i.e., grayscale) displayed by the MEMS device will not accurately reflect the image data to be displayed. A display device employing such a MEMS device will thus not be considered as optimally displaying image data.

BRIEF DESCRIPTION OF THE DRAWINGS

FIG. 1 is a diagram of a display element, in relation to which operation of the display element is described, according to an embodiment of the invention.

FIGS. 3A, 3B, and 3C are diagrams depicting how the display element of FIGS. 2A, 2B, and 2C can be implemented, according to an embodiment of the invention.

FIGS. 4A and 4B are diagrams depicting how the display element of FIGS. 2A, 2B, and 2C can be implemented, according to another embodiment of the invention.

FIGS. 6A and 6B are diagrams depicting a second variation of the display element of FIGS. 4A and 4B, according to an embodiment of the invention.

FIGS. 7A and 7B are diagrams depicting a third variation of the display element of FIGS. 4A and 4B, according to an embodiment of the invention.

DETAILED DESCRIPTION OF THE DRAWINGS

Figure 2A:
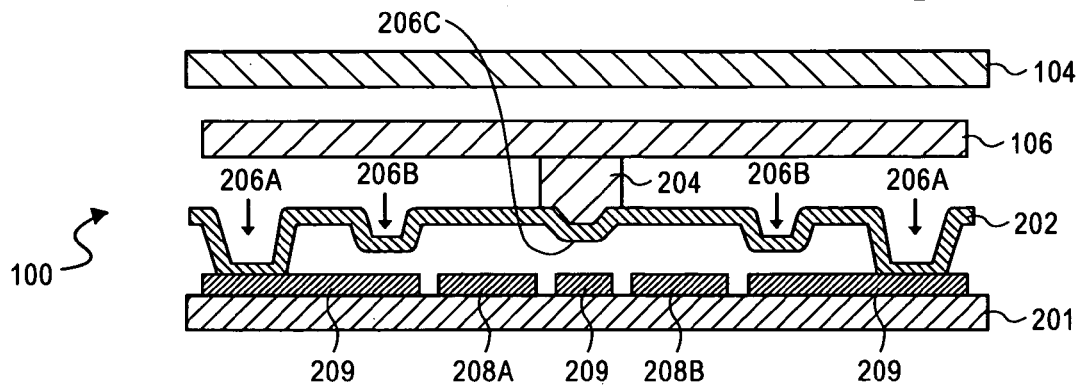
FIGS. 2A, 2B, 2C, and 2D are diagrams of the different states in which a reflective plate of a display element can be positioned precisely and stably, according to varying embodiments of the invention.

FIG. 1 shows a rudimentary view of a display element 100, according to an embodiment of the invention, and which is provided to describe the manner by which the display element 100 operates. The description made in relation to FIG. 1 herein is consistent with that described in the previously filed patent application "Optical interference display device with charge control," published on Nov. 4, 2004, as US published patent application No. 2004/0218251. Therefore, reference to this published patent application may be made for further details as to how the display element 100 generally operates. The display element 100 may be a micro-electromechanical systems (MEMS) device in one embodiment of the invention.

The display element 100 includes a bottom capacitive plate 102 and a top capacitive plate 104. The top capacitive plate 104 is at least substantially transparent. A capacitor is thus defined between the bottom capacitive plate 102 and the top capacitive plate 104. The display element 100 also includes a reflective plate 106 that is electrostatically movably disposed between the bottom capacitive plate 102 and the top capacitive plate 104. The reflective plate 106 may also be referred to as a pixel plate. The reflective plate 106 thus is movable up and down between the plates 102 and 104, as indicated by the arrows 108, in an electrostatic manner. That is, depending on the voltage and/or charge on the various plates 102, 104, and 106, the reflective plate 106 is electrostatically moved to different positions between the bottom capacitive plate 102 and the top capacitive plate 104.

The reflective plate 106 is more generally a mechanism or device, which may be optical or non-optical in nature. In some embodiments of the invention, the element 100 may be a MEMS device used for purposes other than as a display element. In such embodiments, the mechanism may be or include the reflective plate 106, or may not be or include the reflective plate 106. That is, the mechanism may be another type of mechanism in addition to or in lieu of the reflective plate 106. Examples of such a MEMS device include an optical switch based on total internal reflection (TIR), a probe for a scanning tunneling microscope, which is a non-optical device, and so on.

White light enters the display element 100 from and through the top capacitive plate 104, as indicated by the arrow 110. Via optical interference, in accordance with Fabry-Perot filter techniques known within the art, light reflected back upwards by the reflective plate 106 interferes with the entering light 110 and internal reflections from 104. As indicated by the arrow 112, (single) colored light emerges through the top reflective plate 104. The color of the light that emerges through the top reflective plate 104 depends on the position of the reflective plate 106 between the top capacitive plate 104 and the bottom capacitive plate 102. More particularly, radiation entering the display element 100 at the top capacitive plate 104 experiences different optical interference conditions based on the distance of the reflective plate 106 from the capacitive plate 104.

In one embodiment, the reflective plate 106 may be at a distance D from the top capacitive plate 104. In this embodiment, where the distance D is 1,000 Angstrom (Å), no light is reflected, which is the black state of the display element 100. Where the distance D is 2,000 Å, first-order blue light is reflected; where the distance D is 2,500 Å, first-order green light is reflected, and where the distance D is 3,000 Å, first-order red light is reflected. Furthermore, where the distance D is 3,800 Å, second-order blue light is reflected, and where the distance D is 4,800 Å, second-order green light is reflected.

The display element 100 thus is operable by controlling the charge and/or voltage among the plates 102, 104, and 106 to achieve differently colored light output by the display element 100, based on the position of the reflective plate 106 electrostatically dependent on the charge and/or voltage among the plates 102, 104, and 106. In one particular mode of operation, referred to as a dual-gap mode of operation, the bottom capacitive plate 102 is grounded, and the top capacitive plate 104 and the reflective plate 106 are shorted together and set at a variable particular voltage. Alternatively, the top capacitive plate 104 and the reflective plate 106 may be shorted together to ground, and the bottom capacitive plate set at a variable particular voltage. In either instance, the particular voltage controls the electrostatic movement of the reflective plate 106 between the capacitive plates 102 and 104, to determine the light output by the display element 100.

In another particular mode of operation, referred to as a dual-capacitor mode of operation, the bottom capacitive plate 102 is grounded, the top capacitive plate 104 is set at a static particular voltage, and the reflective plate 106 is set at a variable particular voltage. Thus, there is a first capacitor defined between the plates 102 and 106, and a second capacitor defined between the plates 104 and 106. The particular variable of the reflective plate 106 controls the electrostatic movement of the reflective plate 106 between the capacitive plates 102 and 104, to determine the light output by the display element 100. In either embodiment, the gap between the reflective plate 106 and the top capacitive plate 104 can be referred to as the optical gap, corresponding to the distance D described above. The gap between the reflective plate 106 and the bottom capacitive plate 102 can be referred to as the lower electrostatic gap. In the dual-capacitor mode of operation, the gap between the reflective plate 106 and the top capacitive plate 104 can also be referred to as the upper electrostatic gap.

It is noted that in at least some embodiments of the invention, the voltages among the plates 102, 104, and 106 of the display element 100 are initially applied to electrostatically move the reflective plate 106 to a desired position between the capacitive plates 102 and 104 to result in a desired color emanating from the display element 100. Thereafter, the voltages may be removed from the plates 102, 104, and 106 without affecting the position of the reflective plate 106 for at least a substantially long period of time. This is because the voltages applied cause charge to be deposited among the plates 102, 104, and 106, such that one or more capacitors are defined among the plates 102, 104, and 106. Because capacitors inherently store charge, once this charge has been stored within these capacitors, the reflective plate 106 remains in position, even if voltage is removed from the plates 102, 104, and 106. In practice, charge may slowly leak away from one or more of the plates 102, 104, and 106, but for the purposes of a display device utilizing the display element 100, it can be said that the charge remains on the plates 102, 104, and 106 substantially indefinitely.

At least some embodiments of the invention are particularly concerned with precise and stable positioning of the reflective plate 106 between the capacitive plates 102 and 104 of the display element 100. Such precise and stable positioning is desirable because it ensures that the colored light output by the display element 100 is precisely controlled. Without precise and stable positioning of the reflective plate 106, the plate 106 can "creep" over time in one direction or the other denoted by the arrows 108 in FIG. 1, which deleteriously affects image quality, in that the colored light output by the display element 100 is not as it is expected to be. What follows, therefore, is a description of different embodiments in which the reflective plate 106 can be precisely and stably positioned is achieved.

FIGS. 2A, 2B, 2C, and 2D show varying states of the display element 100 in which the reflective plate 106 is precisely and stably differently positioned between the capacitive plates 102 and 104, according to varying embodiments of the invention. In addition to the plates 104 and 106, the display element 100 of FIGS. 2A, 2B, 2C, and 2D includes a flexure 202, a post 204, and one or more electrodes 208A and 208B, collectively referred to as the electrodes 208. The display element also includes landing pads 209. The electrodes 208 and the landing pads 209 make up the bottom capacitive plate in the display element of FIGS. 2A, 2B, 2C, and 2D. It can be said, therefore, that the electrodes 208 are a component or a part of the bottom capacitive plate, and thus are an independent element in and of themselves, but are part of another element, the bottom capacitive plate. The pads 209 and the electrodes 208 are disposed on a substrate 201. Furthermore, the flexure 202 may in actuality or practice include one or more separate flexures, and is fabricated from a rigid but flexible material. The flexure 202 is movably disposed between the capacitive plates 102 and 104.

The flexure 202 enables the reflective plate 106 to be precisely and stably different positioned between the capacitive plates 102 and 104, and is connected to the reflective plate 106 via the post 204. The flexure 202 is said to include or define distance stops 206A, 206B, and 206C, collectively referred to as the distance stops 206. The distance stop 206A may also be referred to as a flexure post, as is described in more detail later in the detailed description. Depending on the voltages at the plates 102, 104, and 106, and at the electrodes 208, the flexure 202 moves downward (or upward) such that its downward (or upward) motion towards the bottom capacitive plate 102 is stopped by a different distance stop. Because the flexure 202 is attached to the reflective plate 106 via the post 204, the reflective plate 106 correspondingly moves as the flexure 202 moves upwards or downwards.

Figure 2B:
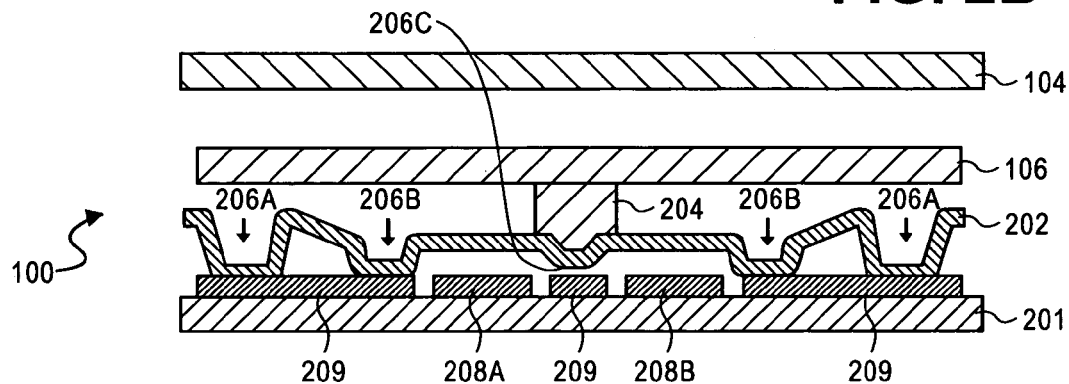
Figure 2C:
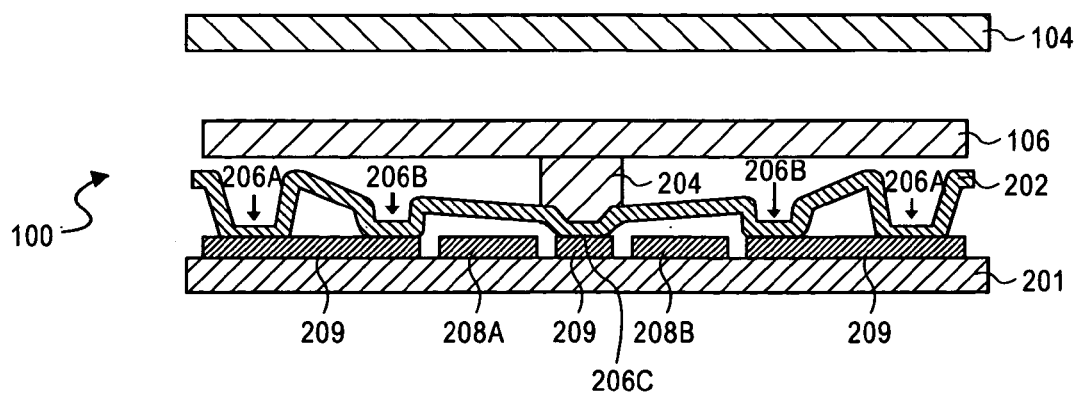

The distance stops may result from the flexure 202 having a particular profile, as is the case in FIGS. 2A, 2B, and 2C. Additionally or alternatively, the distance stops may result from actual physical stops that prevent further motion of the flexure 202 and/or other components of the display element 100, as will be described in relation to FIG. 2D and other, later-introduced figures. Additionally or alternatively still, the distance stops may result from the flexure 202 in actuality including more than one flexure, where each such flexure may correspond to a distance stop.

More specifically, the electrodes 208 correspond to the flexure 202, in that energizing different of the electrodes causes the flexure 202 to move to different of the distance stops 206, and resultantly causing the reflective plate 106 to move to different positions between the capacitive plates 102 and 104. The electrodes 208 are situated on or near the bottom capacitive plate 102. Thus, rather than applying a particular voltage over the entire bottom capacitive plate 102 to cause the reflective plate 106 to move to a desired position between the capacitive plates 102 and 104, particular voltages are applied to various of the electrodes 208 to cause the reflective plate 106 to move to the desired position.

In FIG. 2A in particular, all of the electrodes 208 and the top capacitive plate 104 are at the same voltage. As a result, there is no electrostatic potential between the reflective plate 106 and the bottom capacitive plate 102. In this default position, the flexure 202 rests at, or moves to, the distance stop 206A. As such, the reflective plate 106 is at a first position between the capacitive plates 102 and 104, corresponding to a first state of the display element 100.

The distance stop 206A is a special distance stop that can also be referred to as a flexure post. The flexure post is fixed to the bottom capacitive plate 102 at the left and right landing pads 209, and supports the flexure 202 above the plate 102. Thus, in FIG. 2A, where all the electrodes 208 and the top capacitive plate 104 are at the same voltage, the position of the flexure 202 is determined by the height of the flexure post. The left and the right landing pad sites 209 are zero-electric field landing pads, and support the flexure 202 when there is no electrical field (i.e., all the electrodes 208 and the top capacitive plate 104 are at the same voltage). Furthermore, the middle landing pad site 209 is also a zero-electric field landing pad.

In FIG. 2B, the right electrode 208B and the top capacitive plate 104 are at the same, first voltage, and the left electrode 208B is at a second voltage different than the first voltage. More generally, a first subset of the electrodes 208 and the top capacitive plate 104 are at the first voltage, and a second subset of the electrodes 208 is at the second voltage, where each subset of the electrodes 208 includes one or more electrodes, all of the subsets together encompass all of the electrodes 208, and any given electrode is in exactly one subset. An electrostatic force is created between the reflective plate 106 and the bottom capacitive plate 102, which causes the flexure 202 to be pulled down to, or move to, the distance stop 206B. As such, the reflective plate 106 is at a second position between the capacitive plates 102 and 104 that is closer to the bottom capacitive plate 102 than the first position, and which corresponds to a second state of the display element 100.

In FIG. 2C, the top capacitive plate 104 is at the same, first voltage. The left electrode 208A is at a second voltage different than the first voltage. The right electrode 208B is at a third voltage different than the first and the second voltages. More generally, the top capacitive plate 104 is at the first voltage, a second subset of the electrodes 208 is at the second voltage, and a third subset of the electrodes 208 is at the third voltage. The electrostatic force between the reflective plate 106 and the bottom capacitive plate 102 increases, which causes the flexure 202 to be pulled down further. As such, the flexure 202 is pulled down to, or moves to, the distance stop 206C, against the middle landing pad 209. The reflective plate 106 is now at a third position between the capacitive plates 102 and 104 that is closer to the bottom capacitive plate 102 than the first and the second positions, and which corresponds to a third state of the display element 100.

Thus, the distance stops 206 of the flexure 202 of the display element 100 in FIGS. 2A, 2B, and 2C allow positioning of the reflective plate 106 between the capacitive plates 102 and 104 to be precisely and stably controlled. In effect, the distance stops 206 control movement of the reflective plate 106 so that it moves to one of a number of discrete positions corresponding to the distance stops 206. Precise control over the voltages applied to the electrodes 208 is unnecessary, because once the flexure 202 moves to a given distance stop, it stays there until the voltages applied to the electrodes 208 change considerably. As such, "creep" of the reflective plate 106 away from a desired position is less likely to occur, and more tolerance can be permitted of the voltages applied to the electrodes 208.

Figure 2D:
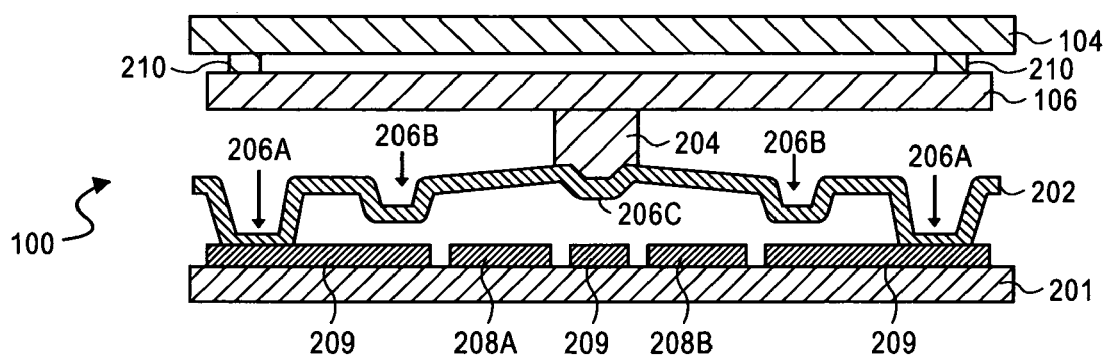

In FIG. 2D, an additional distance stop is defined via physical stops, or bumps, 210, attached to the underside of the top capacitive plate 104. All of the electrodes 208 are at the same, first voltage, but the top capacitive plate 104 is at a fourth voltage different than the first voltage. The electrostatic force created between the reflective plate 106 and the top capacitive plate 104 causes the reflective plate 106 to be pulled up to, or move to, the physical stops 210. As such, the reflective plate 106 is at a fourth position between the capacitive plates 102 and 104 that is closer to the top capacitive plate 102 than the first position, and which corresponds to a fourth state of the display element 100.

FIGS. 3A, 3B, and 3C show how the display element 100 of FIGS. 2A, 2B, and 2C can be implemented, according to an embodiment of the invention. However, the display element 100 of FIGS. 3A, 3B, and 3C differs from that of FIGS. 2A, 2B, and 2C in that the former display element has three electrodes 208, including an electrode 208, whereas the latter display element just has two electrodes 208. In FIG. 3A, a perspective view of the bottom capacitive plate 102, the landing pads 209, and the electrodes 208 of the display element 100 is shown. In FIG. 3B, what is added to the perspective view of the display element 100 of FIG. 3A are the flexure 202, the reflective plate 106, and posts 302A, 302B, 302C, and 302D, collectively referred to as the posts 302. In particular, the flexure 202 includes flexures 202A, 202B, and 202C. The reflective plate 106 includes sub-concentric reflective sub-plates 106A; 106B, and 106C. The top capacitive plate 104, not depicted in FIG. 3B, rests on and/or is attached to the posts 302.

In FIG. 3C a partial cross-sectional view of the display element 100 is shown, including the substrate 201, the top capacitive plate 104, the electrodes 208, the reflective sub-plates 106A, 106B, and 106C, a reflective plate 106D, and the flexure 202. Particularly shown in FIG. 3C are physical stops 310A, 310B, and 310C, collectively referred to as the physical stops 310, and corresponding to the distance stops 206 of the flexure 202 as depicted in FIGS. 2A, 2B, 2C, and 2D. Thus, in the first state of the reflective plate 106, the electrode 208A pulls down the flexure 202A and the reflective sub-plate 106A in FIG. 3C towards the substrate 201 until the physical stop 310A, corresponding to the distance stop 206A in FIG. 2A, contacts the landing pad 209.

In the second state of the reflective plate 106 in FIG. 3C, the electrode 208B is energized differently, which pulls the flexure 202B and the reflective sub-plate 106B downward until the physical stop 310B contacts the landing pad 209. The physical stop 310B thus corresponds to the distance stop 206B in FIG. 2B. In the third state of the reflective plate 106 in FIG. 3C, the electrode 208C is energized differently, which pulls the flexure 202C and the reflective sub-plate 106C downward until the physical stop 310C contacts the landing pad 209. The physical stop 310C thus corresponds to the distance stop 206C in FIG. 2C.

FIGS. 4A and 4B show how the display element 100 of FIGS. 2A, 2B, and 2C can be implemented, according to another embodiment of the invention. In FIG. 4A, a top perspective view of some of the components of the display element 100 is shown. By comparison, in FIG. 4B, a bottom perspective view of some of the components of the display element 100 is shown. The reflective plate 106 is depicted just in FIG. 4B, and the capacitive plates 102 and 104 are not depicted in either FIG. 4A or FIG. 4B.

The display element 100 of FIGS. 4A and 4B includes a rigid frame 402, which may be fabricated from a rigid but flexible polymer or another type of material. A first flexure 202A spans the rigid frame 402 from one end of the rigid frame 402 to the other end of the rigid frame 402. Underneath the first flexure 202A is a corresponding first electrode 208A. Two second flexures 202B also span the rigid frame 402 from one end of the rigid frame 402 to the other end of the rigid frame 402. Underneath the second flexures 202B are corresponding second electrodes 208B. Posts 204A and 204B, collectively referred to as the posts 204, attach the flexures 202B to the reflective plate 106. An additional post 302 connects the flexure 202A, and thus the rigid frame 402, to the bottom capacitive plate 102, which is not shown in FIGS. 4A and 4B.

The additional post 302 may also be considered a physical stop corresponding to the distance stop 206A of the flexure 202 as depicted in FIGS. 2A, 2B, 2C and 2D. Thus, in the first state of the reflective plate 106 in FIG. 2A, the reflective plate 106 in FIGS. 4A and 4B is not moved down, and rests on the posts 204, where the rigid frame 402, via the flexure 202A, is not moved down, and rests on the post 302. Physical stops 404A, 404B, 404C, and 404D, collectively referred to as the physical stops 404, are underneath the rigid frame 402 near its corners, and correspond to the distance stop 206B of the flexure 202 as depicted in FIGS. 2A, 2B, 2C, and 2D. Thus, in the second state of the reflective plate 106 in FIG. 2B, the reflective plate 106 in FIGS. 4A and 4B is pulled down. This is because the flexure 202A is pulled down towards the electrode 208A, causing the rigid frame 402 to be pulled down until it hits the physical stop 404.

It is noted that in at least some embodiments of the invention, the stops 404 are at the same level as the rigid frame 402 where the thickness of the rigid frame 402 and the flexures 202 are not equal to one another, which is not particularly depicted in FIGS. 4A and 4B. Otherwise, contact between the flexures 202 and the stops 404 can occur where the frame 402 is in contact with the stops 404. Therefore, the thickness of the flexures 202 may be thinner than the thickness of the rigid frame 402.

Furthermore, physical stops 406A and 406B, collectively referred to as the physical stops 406, are underneath the flexures 202B. The physical stops 406A and 406B correspond to the distance stop 206C of the flexure 202 as depicted in FIGS. 2A, 2B, 2C, and 2D. Thus, in the third state of the reflective plate 106 in FIG. 2C, the reflective plate 106 in FIGS. 4A and 4B is pulled down further. This is because the flexures 202B are pulled down towards the electrodes 208B until the flexures 202B hit the stops 406.

Therefore, in the embodiment of FIGS. 4A and 4B, it can be said that the physical stops 404 correspond to the flexure 202A, in that movement of the flexure 202A as a result of energizing the electrode 208A appropriately causes the rigid frame 402 to move downward until it hits the physical stops 404. Furthermore, it can be said that the physical stops 406 correspond to the flexures 202B, in that movement of the flexures 202B as a result of energizing the electrodes 208B appropriately causes the flexures 202B to move downward until they hit the physical stops 406. The physical stops 404 and 406, as well as the post 302 which implicitly functions as a physical stop, also correspond to the distance stops 206, as has been described.

The embodiment of FIGS. 4A and 4B can also be generally said to include the rigid frame 402 as attached to a first subset of the flexures 202, specifically the flexure 202A, and corresponding to a first subset of the physical stops, specifically the physical stops 404, and to a first subset of the distance stops, specifically the distance stop 206B of FIG. 2B. The embodiment of FIGS. 4A and 4B can also be generally said to include the reflective plate 106 as attached to a second subset of the flexures 202, specifically the flexures 202B via the posts 204, and corresponding to a second subset of the physical stops, specifically the physical stops 406, and to a second subset of the distance stops, specifically the distance stop 206C of FIG. 2C. As depicted in FIGS. 4A and 4B, the flexures 202 are organized in rows between two ends of the rigid frame 402.

Figure 5B:
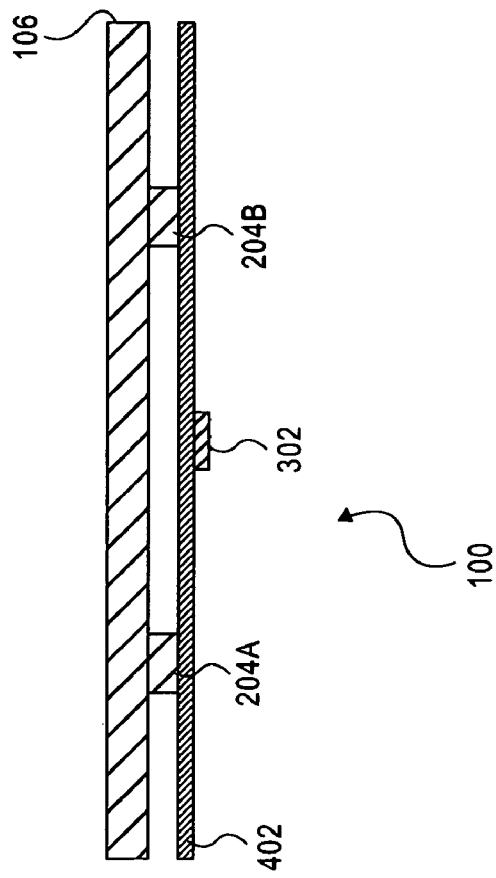
FIGS. 5A and 5B are diagrams depicting a first variation of the display element of FIGS. 4A and 4B, according to an embodiment of the invention.
Figure 5A:
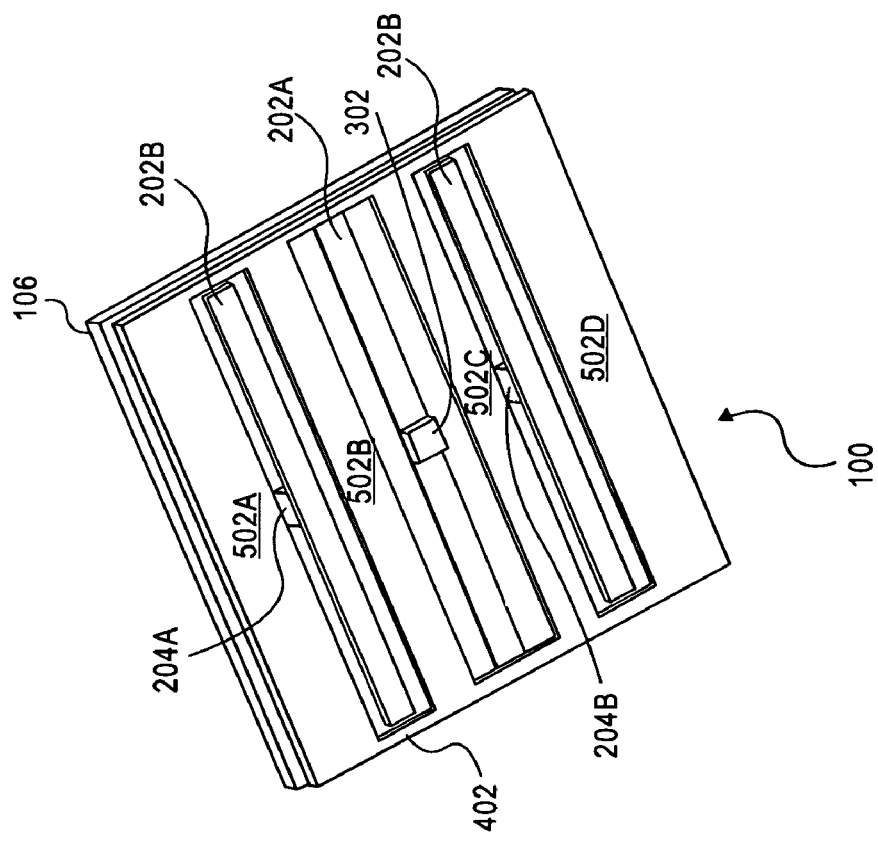

FIGS. 5A and 5B show a variation of the display element 100 of FIGS. 4A and 4B, according to an embodiment of the invention. In FIG. 5A, a bottom perspective view of some of the components of the display element 100 is shown. By comparison, in FIG. 5B, a cross-sectional view of the display element 100 is shown. The capacitive plates 102 and 104, the electrodes 208, and the physical stops 404 are not depicted in either FIG. 5A or FIG. 5B.

The primary difference between FIGS. 5A and 5B and FIGS. 4A and 4B is that there are thick cross beams 502A, 502B, 502C, and 502D, collectively referred to as the cross beams 502, extending between the ends of the rigid frame 402 in FIGS. 5A and 5B, where these cross beams 502 are not present in FIGS. 4A and 4B. The inclusion of the cross beams 502 can be advantageous, however. In particular, a lower voltage may be needed to pull down the rigid frame 402 to its corresponding stops 404 (not shown in FIGS. 5A and 5B), due to the larger area of the rigid frame 402 and the cross beams 502 in combination.

FIGS. 6A and 6B show another variation of the display element 100 of FIGS. 4A and 4B, according to an embodiment of the invention. In FIG. 6A, a bottom perspective view of some of the components of the display element 100 is shown. By comparison, in FIG. 6B, a cross-sectional view of the display element 100 is shown. The capacitive plates 102 and 104, the electrodes 208, and the physical stops 404 are not depicted in either FIG. 6A or FIG. 6B.

In FIGS. 6A and 6B, there is a single cross beam 502 extending between the ends of the rigid frame 402. There are also two of the flexures 202A, and thus two of the posts 302, identified as the posts 302A and 302B in FIGS. 6A and 6B. However, the primary difference between FIGS. 6A and 6B and FIGS. 4A and 4B is that the flexures 202A and 202B are wider at the ends of the rigid frame 402, and are tapered such that the flexures 202A and 202B are narrower in the middle between the ends of the rigid frame 402, where the flexures 202A and 202B are not tapered in FIGS. 4A and 4B.

The tapering of the flexures 202A and 202B can be advantageous, however. In particular, less strain may be needed to pull down the flexures 202A and 202B, since the flexures 202A and 202B are tapered. This is desirable, because this means that less overall force, and thus a lower voltage applied to the electrodes 208, is needed to pull down the flexures 202A and 202B, and therefore to pull down the rigid frame 402 and the reflective plate 106.

FIGS. 7A and 7B show a third variation of the display element of FIGS. 4A and 4B, according to an embodiment of the invention. In FIG. 7A, a bottom perspective view of some of the components of the display element 100 is shown. By comparison, in FIG. 7B, a cross-sectional view of the display element 100 is shown. The capacitive plates 102 and 104, the electrodes 208, and the physical stops 404 are not depicted in either FIG. 7A or FIG. 7B.

In FIGS. 7A and 7B, there are two cross beams 502A and 502B extending between the ends of the rigid frame 402. An additional difference between FIGS. 7A and 7B and FIGS. 4A and 4B is that the flexures 202A and 202B are wider at the ends of the rigid frame 402 and at the middle between the ends of the rigid frame 402. The flexures 202A and 202B are narrower between the middle and the ends of the rigid frame 402, such that they are tapered, where the flexures 202A and 202B are not tapered in FIGS. 4A and 4B.

The embodiment of FIGS. 7A and 7B has the same advantages of the embodiment of FIGS. 6A and 6B, with more of the advantages of the embodiment of FIGS. 5A and 5B. That is, like the embodiment of FIGS. 6A and 6B, the embodiment of FIGS. 7A and 7B has tapered flexures. Furthermore, there are more cross beams 502 in the embodiment of FIGS. 7A and 7B than in the embodiment of FIGS. 6A and 6B, such that it has more of the advantages that these cross beams 502 provide, as has been described in relation to the embodiments of FIGS. 5A and 5B.

Figure 8B:
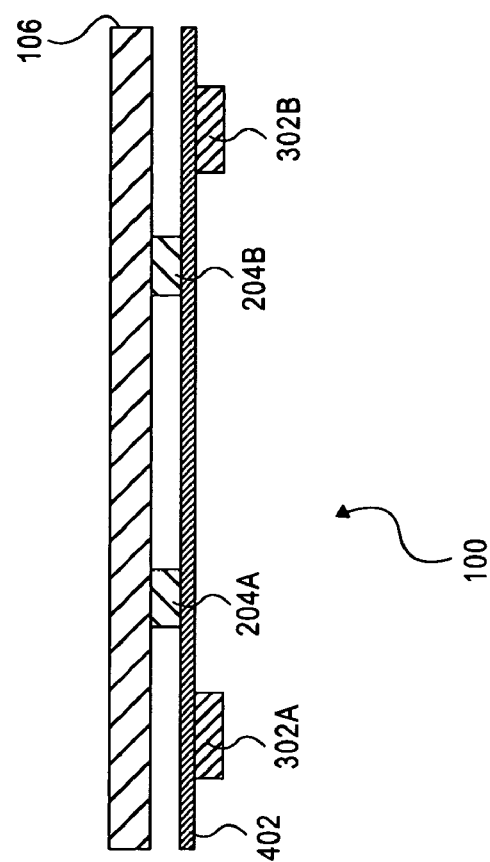
FIGS. 8A and 8B are diagrams depicting a fourth variation of the display element of FIGS. 4A and 4B, according to an embodiment of the invention.
Figure 8A:
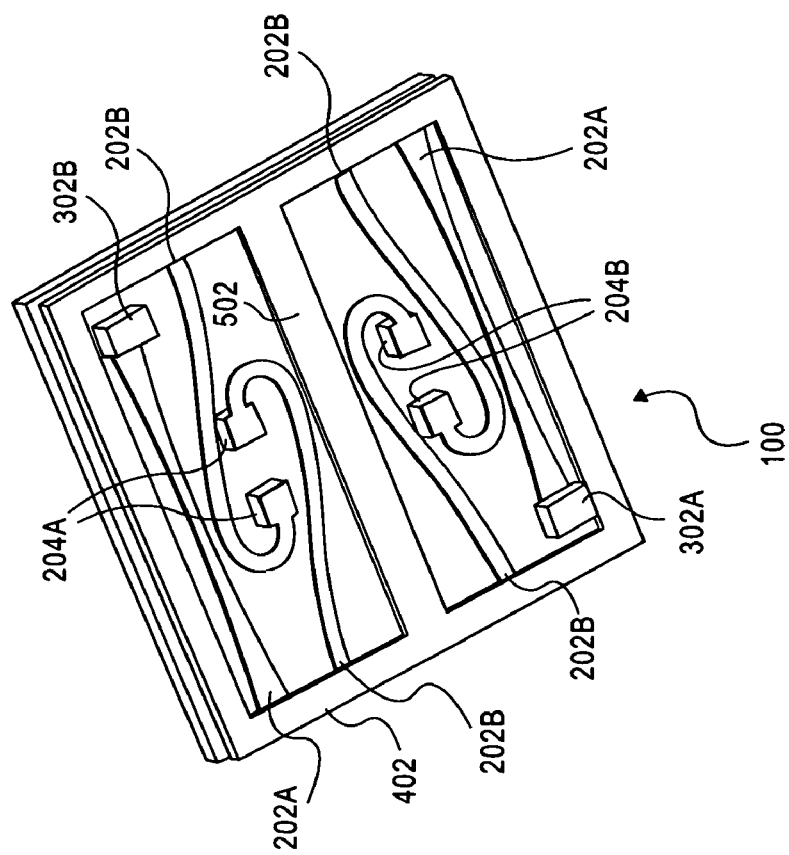

FIGS. 8A and 8B show a fourth variation of the display element of FIGS. 4A and 4B, according to an embodiment of the invention. In FIG. 8A, a bottom perspective view of some of the components of the display element 100 is shown. By comparison, in FIG. 8B, a cross-sectional view of the display element 100 is shown. The capacitive plates 102 and 104, the electrodes 208, and the physical stops 404 are not depicted in either FIG. 8A or FIG. 8B.

In FIGS. 8A and 8B, there is one cross beam 502 extending between the ends of the rigid frame 402. Like the embodiment of FIGS. 6A and 6B, there are two tapered flexures 202A, such that there are two posts 302A and 302B, in FIGS. 8A and 8B. An additional difference in FIGS. 8A and 8B is that there are four flexures 202B, instead of two flexures 202B in FIGS. 4A and 4B. As such, there are two posts 204A and two posts 204B in the embodiment of FIGS. 8A and 8B. Unlike in FIGS. 4A and 4B, 5A and 5B, 6A and 6B, and 7A and 7B, in which all the flexures 202 are organized in rows between and extending from one end of the rigid frame 402 to another end of the rigid frame 402, the flexures 202B in FIGS. 8A and 8B in particular do not each completely extend from one end of the rigid frame 402 to another end of the rigid frame 402. The flexures 202B in FIGS. 8A and 8B also curve in a manner in which they do not in FIGS. 4A and 4B, 5A and 5B, 6A and 6B, and 7A and 7B.

Increasing the number of the flexures 202B, and curving the flexures 202B, in the embodiment of FIGS. 8A and 8B can be advantageous. In particular, the larger number of these flexures 202B, and their curvature, provides for greater flexibility. This is especially the case in light of undesirable thermal strain. That is, the flexures 202B in the embodiment of FIGS. 8A and 8B are more accommodating to such inevitable thermal strain, where potentially high operating temperatures can otherwise cause the flexures 202B to have less flexibility as a result of the thermal strain from such high operating temperatures.

Figure 9:
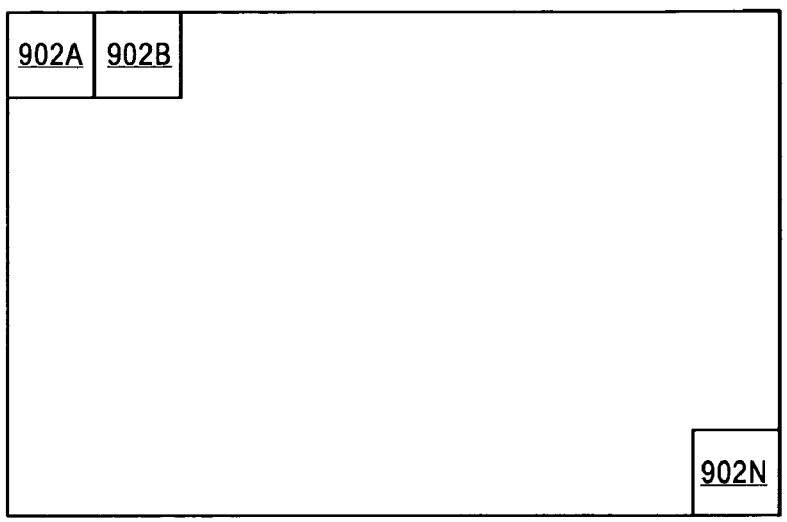
FIG. 9 is a rudimentary diagram of a display device, according to an embodiment of the invention.

FIG. 9 shows a representative display device 900, according to an embodiment of the invention. The display device 900 includes a number of display elements 902A, 902B, ..., 902N, collectively referred to as the display elements 902, and which corresponds to the pixels of the display device 900. As can be appreciated by those of ordinary skill within the art, the display device 900 typically includes other components, besides the display elements 902. Each of the display elements 902 can be implemented as the display element 100 of one or more of the various embodiments that have been described. Thus, the display device 900 is such that voltage may need to be applied to the individual display elements 902 just when they are changing state, and further the display elements 902 precisely and stably maintain their states, as has been described.

Figure 10:
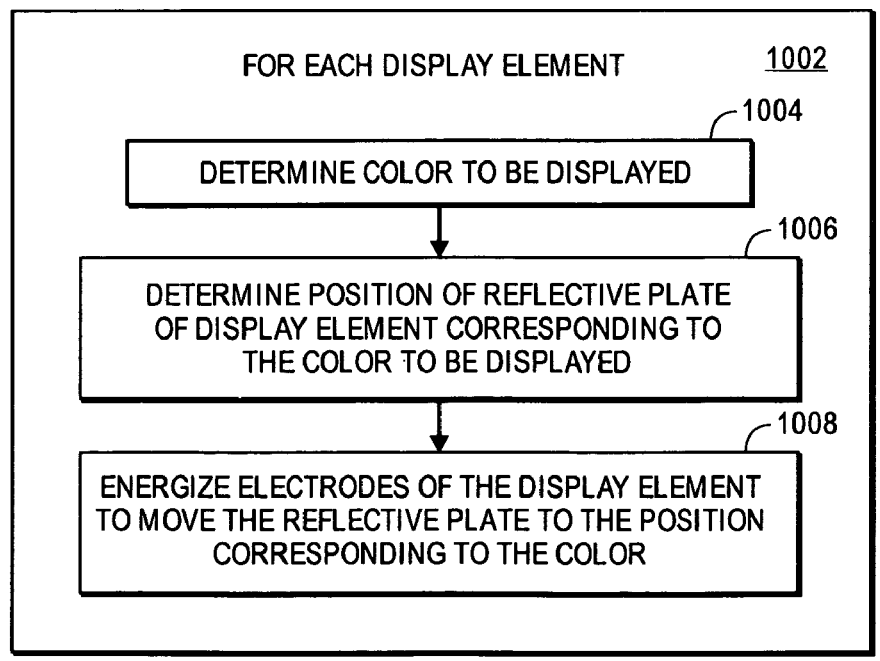
FIG. 10 is a flowchart of a method, according to an embodiment of the invention.

FIG. 10 shows a rudimentary method 1000, according to an embodiment of the invention. As indicated by part 1002 of the method 1000, the method 1000 is performed for each display element of a display device that corresponds to a pixel of the display device. The color to be displayed by the display element in question is determined as one of a discrete number of colors (1004), corresponding to the different positions to which the reflective plate of the display element can be moved between the top and the bottom capacitive plates of the display element. For example, as has been described, there may be a black, no-color state, a first-order red state, a first-order green state, a first-order blue state, and so on, each of which correspond to a different position of the reflective plate.

Therefore, the position of the reflective plate of the display element that corresponds to the color to be displayed by the display element is determined (1006). Thereafter, the electrodes of the display element are accordingly energized to move the reflective plate to the position corresponding to the color (1008). Energizing the electrodes causes one or more flexures of the display element to a given distant stop, which results in the reflective plate moving to the position corresponding to the color to be displayed by the display element, as has been described.

For instance, at least one of the flexures may move to a first distance stop where a top capacitive plate of the display element and all the electrodes are at a first voltage level, such that the reflective plate moves to a first position corresponding to a first color, as has been described in relation to FIG. 2A. As another example, at least one of the flexures may move to a second distance stop where the top capacitive plate and a first subset of the electrodes are at the first voltage level, and a second subset of the electrodes are at a second voltage level, such that the reflective plate moves to a second position corresponding to a second color, as has been described in relation to FIG. 2B. As a third example, at least one of the flexures may move to a third distance stop where the top capacitive plate and the first subset of electrodes are at the first voltage level, the second subset of electrodes are at the second voltage level, and a third subset of the electrodes are at a third voltage level, such that the reflective plate moves to a third position corresponding to a third color, as has been described in relation to FIG. 2C.

Embodiments of the invention thus provide for stable and precise positioning of a reflective plate within a display element, so that stable and precise color display is achieved by the display element. Such stable and precise positioning of the reflective element is enabled by one or more flexures of the display element moving to one of a number of different distance stops. These distance stops may correspond to actual physical stops, or bumps, or they may be based on a profile of the flexures.

We claim:

1. A micro-electromechanical systems (MEMS) device comprising:
   a bottom capacitive plate;
   a top capacitive plate, such that a capacitor is definable between the bottom and the top capacitive plates;
   a mechanism electrostatically movably disposed between the bottom and the top capacitive plates;
   one or more flexures movably disposed between the bottom capacitive plate and the mechanism and having distance stops between the bottom capacitive plate and the mechanism corresponding to maximum downward movement; and,
   one or more electrodes of the bottom capacitive plate and corresponding to the flexures, such that energizing different of the electrodes causes the flexures to move to different of the distance stops, resultantly causing the mechanism to move to different positions between the bottom and the top capacitive plates,
   wherein at least one of the flexures move to a first distance stop where the top capacitive plate and all the electrodes are at a first voltage level, such that the mechanism moves to a first position between the bottom and the top capacitive plates, corresponding to a first state of the MEMS device.

2. The MEMS device of claim 1, wherein at least one of the flexures move to a second distance stop where the top capacitive plate and a first subset of the electrodes are at the first voltage level and a second subset of the electrodes are at a second voltage level, such that the mechanism moves to a second position between the bottom and the top capacitive plates closer to the bottom capacitive plate than the first position and corresponding to a second state of the MEMS device.

3. The MEMS device of claim 2, wherein at least one of the flexures move to a third distance stop where the top capacitive plate and the first subset of the electrodes are at the first voltage level, the second subset of the electrodes are at the second voltage level, and a third subset of the electrodes are a third voltage level, such that the mechanism moves to a third position between the bottom and the top capacitive plates closer to the bottom capacitive plate than the second position and corresponding to a third state of the MEMS device.

4. The MEMS device of claim 3, wherein where the top capacitive plate is at a fourth voltage level and all the electrodes are at the first voltage level, the mechanism moves to a fourth position between the bottom and the top capacitive plates closer to the top capacitive plate than the first position and corresponding to a fourth state of the MEMS device.

5. The MEMS device of claim 1, wherein the one or more flexures comprise a plurality of flexures.

6. The MEMS device of claim 1, wherein the one or more flexures comprise a plurality of flexures, the MEMS device further comprising a plurality of physical stops corresponding to the flexures and to the distance stops.

7. The MEMS device of claim 1, wherein radiation entering the MEMS device at the top capacitive plate is reflected back upwards by the mechanism differently based on a position of the mechanism between the bottom and the top capacitive plates.

8. The MEMS device of claim 1, wherein the MEMS device is a display element, and the mechanism is an optical mechanism comprising a reflective plate, such that the radiation entering the MEMS device is visible white light and is reflected back as visible light of a single color.

9. A micro-electromechanical systems (MEMS) device comprising:
   a bottom capacitive plate;
   a top capacitive plate, such that a capacitor is definable between the bottom and the top capacitive plates;
   a mechanism electrostatically movably disposed between the bottom and the top capacitive plates;
   a plurality of flexures movably disposed between the bottom capacitive plate and the mechanism and having distance stops between the bottom capacitive plate and the mechanism corresponding to maximum downward movement; and,
   one or more electrodes of the bottom capacitive plate and corresponding to the flexures, such that energizing different of the electrodes causes the flexures to move to different of the distance stops, resultantly causing the mechanism to move to different positions between the bottom and the top capacitive plates,
   wherein the mechanism comprises a plurality of sub-plates having physical stops corresponding to the distance stops of the flexures.

10. The MEMS device of claim 9, wherein the sub-plates are concentric to one another.

11. The MEMS device of claim 9, wherein radiation entering the MEMS device at the top capacitive plate is reflected back upwards by the mechanism differently based on a position of the mechanism between the bottom and the top capacitive plates.

12. The MEMS device of claim 9, wherein the MEMS device is a display element, and the mechanism is an optical mechanism comprising a reflective plate, such that the radiation entering the MEMS device is visible white light and is reflected back as visible light of a single color.

13. A micro-electromechanical systems (MEMS) device comprising:
   a bottom capacitive plate;
   a top capacitive plate, such that a capacitor is definable between the bottom and the top capacitive plates;
   a mechanism electrostatically movably disposed between the bottom and the top capacitive plates;
   a plurality of flexures movably disposed between the bottom capacitive plate and the mechanism and having distance stops between the bottom capacitive plate and the mechanism corresponding to maximum downward movement;
   one or more electrodes of the bottom capacitive plate and corresponding to the flexures, such that energizing different of the electrodes causes the flexures to move to different of the distance stops, resultantly causing the mechanism to move to different positions between the bottom and the top capacitive plates;
   a plurality of physical stops corresponding to the flexures and the distance stops,
   wherein the MEMS device further comprises a rigid frame attached to a first subset of the flexures and corresponding to a first subset of the physical stops and to a first subset of the distance stops, the mechanism attached to a second subset of the flexures and corresponding to a second subset of the physical stops and to a second subset of the distance stops.

14. The MEMS device of claim 13, wherein the flexures are organized in rows between a first end and a second end of the rigid frame.

15. The MEMS device of claim 14, wherein the rigid frame comprises one or more cross beams between the first and the second ends of the rigid frame.

16. The MEMS device of claim 14, wherein the flexures are wider at the first and the second ends of the rigid frame and are tapered such that the flexures are narrower at a middle between the first and the second ends of the rigid frame.

17. The MEMS device of claim 14, wherein the flexures are wider at the first and the second ends of the rigid frame and at a middle between the first and the second ends of the rigid frame, and are tapered such that the flexures are narrower between the middle and the first end of the rigid frame and between the middle and the second end of the rigid frame.

18. The MEMS device of claim 13, wherein radiation entering the MEMS device at the top capacitive plate is reflected back upwards by the mechanism differently based on a position of the mechanism between the bottom and the top capacitive plates.

19. The MEMS device of claim 13, wherein the MEMS device is a display element, and the mechanism is an optical mechanism comprising a reflective plate, such that the radiation entering the MEMS device is visible white light and is reflected back as visible light of a single color.

* * * * *

UNITED STATES PATENT AND TRADEMARK OFFICE
CERTIFICATE OF CORRECTION

| | | |
|---|---|---|
| PATENT NO. | : 7,741,751 B2 | |
| APPLICATION NO. | : 11/479271 | |
| DATED | : June 22, 2010 | |
| INVENTOR(S) | : Faase et al. | |

It is certified that error appears in the above-identified patent and that said Letters Patent is hereby corrected as shown below:

On the title page, in Item (75), Inventors, in column 1, line 3, delete "Eric L. Nikkei," and insert -- Eric L. Nikkel, --, therefor.

Signed and Sealed this
Twenty-eighth Day of December, 2010

David J. Kappos
*Director of the United States Patent and Trademark Office*